United States Patent
Chun et al.

(10) Patent No.: US 7,643,003 B2
(45) Date of Patent: Jan. 5, 2010

(54) LIQUID CRYSTAL DISPLAY DEVICE HAVING A SHIFT REGISTER

(75) Inventors: Min Doo Chun, Seoul (KR); Kwon Shik Park, Seoul (KR); Soo Young Yoon, Gyeonggi-do (KR); Tae Woong Moon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 649 days.

(21) Appl. No.: 11/372,094

(22) Filed: Mar. 10, 2006

(65) Prior Publication Data

US 2007/0001987 A1 Jan. 4, 2007

(30) Foreign Application Priority Data

Jun. 30, 2005 (KR) .............. 10-2005-0057624
Mar. 7, 2006 (KR) .............. 10-2006-0021498

(51) Int. Cl.
*G09G 3/36* (2006.01)
(52) U.S. Cl. .................. 345/100; 345/92; 345/99
(58) Field of Classification Search .......... None
See application file for complete search history.

(56) References Cited

U.S. PATENT DOCUMENTS

| 5,510,805 | A  | * | 4/1996  | Lee ....................... 345/58 |
| 6,300,928 | B1 | * | 10/2001 | Kim ....................... 345/92 |
| 6,426,743 | B1 | * | 7/2002  | Yeo et al. ................ 345/213 |
| 2002/0093474 | A1 | * | 7/2002  | Toyoshima et al. ......... 345/87 |
| 2002/0149318 | A1 | * | 10/2002 | Jeon et al. .............. 315/169.1 |
| 2003/0231735 | A1 | * | 12/2003 | Moon et al. .............. 377/64 |

* cited by examiner

*Primary Examiner*—Alexander Eisen
*Assistant Examiner*—Matthew Yeung
(74) *Attorney, Agent, or Firm*—Holland & Knight LLP

(57) ABSTRACT

An LCD device includes a plurality of gate lines formed in an LCD panel; a plurality of driving stages, each of which sequentially outputting a respective enabling scan pulse to a corresponding one of the plurality of gate lines; at least one dummy stage responsive to an enabling scan pulse from a first one of the plurality of driving stages and supplying a disabling scan pulse to a second one of the plurality of driving stages to disable outputting of the enabling scan pulse; and a dummy gate line electrically connected to the at least one dummy stage.

6 Claims, 7 Drawing Sheets

LIQUID CRYSTAL DISPLAY DEVICE HAVING A SHIFT REGISTER

This application claims the benefit of Korean Patent Application No. 2005-57624, filed in Korea on Jun. 30, 2005, and No. 2006-21498, filed in Korea on Mar. 7, 2006, both of which are hereby incorporated by reference in their entirety.

BACKGROUND OF THE INVENTION

1. Field of the Invention

The present invention relates to a liquid crystal display (LCD) device, and more particularly, to a liquid crystal display (LCD) device having a shift register with increased lifetime.

2. Discussion of the Related Art

In general, a liquid crystal display (LCD) device displays images by controlling light transmittance of liquid crystal. For this, the LCD device is provided with an LCD panel including a plurality of pixel regions arranged in a matrix, and a driving circuit for driving the LCD panel.

The LCD panel includes a plurality of gate lines crossing a plurality of data lines to define a plurality of pixel regions. A thin film transistor (TFT) is provided in each pixel region. A plurality of pixel electrodes and a common electrode are formed in the LCD panel to apply an electric field to the respective pixel regions. Each of the pixel electrodes is connected with one of the data lines through a drain terminal and a source terminal of a corresponding TFT functioning as a switching device. The thin film transistor TFT is turned-on by a scan pulse applied to a gate terminal thereof through the gate line, while a data signal from the data line is charged in the pixel region.

The driving circuit includes a gate driver for driving the gate lines, a data driver for driving the data lines, a timing controller for supplying control signals to control the gate and data drivers, and a power supply for supplying driving voltages for the LCD device. The timing controller controls the driving timing of the gate and data drivers, and supplies pixel data signals to the data driver. The power supply generates driving voltages such as a common voltage VCOM, a gate high-voltage signal VGH, and a gate low-voltage signal VGL by raising or reducing an input power.

The gate driver supplies scan pulses to the gate lines in sequence, so as to sequentially drive liquid crystal cells of the LCD panel by one line. The gate driver includes a shift register for sequentially outputting the scan pulses. The data driver supplies a pixel voltage signal to each of the data lines whenever the scan pulse is supplied to any one of the gate lines. Accordingly, the LCD device displays images by controlling the light transmittance with the electric field applied between the pixel electrode and the common electrode according to the pixel voltage signal by each liquid crystal cell.

FIG. 1 illustrates a shift register according to the related art. As shown in FIG. 1, the shift register according to the related art is provided with 'n' stages (AST1 to ASTn) which are connected with one another, and one dummy stage ASTn+1. At this time, each of the stages AST1 to ASTn+1 outputs one scan pulse Vout1 to Voutn+1. The first to n-th stages AST1 to ASTn and the dummy stage ASTn+1 respectively output the scan pulses Vout1 to Voutn+1 in sequence. The scan pulses outputted from the first to n-th stages AST1 to ASTn except the dummy stage ASTn+1 are sequentially supplied to the gate lines, thereby scanning the gate lines in sequence.

In this case, a first voltage source VDD, a second voltage source VSS, and two clock pulses among first to fourth clock pulses CLK1 to CLK4 of the sequence phase difference are supplied to all the stages AST1 to ASTn+1. At this time, the first voltage source VDD is a voltage source of a positive polarity, and the second voltage source VSS is a ground voltage.

In the meantime, a start pulse SP as well as the first voltage source VDD, the second voltage source VSS, and the two clock pulses is also supplied to the first stage AST1 which is positioned uppermost.

An operation of the shift register according to the related art will be explained as follows. First, as the start pulse SP from the timing controller (not shown) is applied to the first stage AST1, the first stage AST1 is enabled in response to the start pulse SP. Then, as the first and second clock pulses CLK1 and CLK2 are applied to the enabled first stage AST1, the first stage AST1 outputs the first scan pulse Vout1, and supplies the first scan pulse Vout1 to the first gate line and the second stage AST2. Then, the second stage AST2 is enabled in response to the first scan pulse Vout1.

According as the second and third clock pulses CLK2 and CLK3 from the timing controller are applied to the enabled second stage AST2, the second stage AST2 outputs the second scan pulse Vout2, and supplies the second scan pulse Vout2 to the second gate line, the third stage AST3, and the first stage AST1. Then, the third stage AST3 is enabled in response to the second scan pulse Vout2, and the first stage AST1 is disabled in response to the second scan pulse Vout2, thereby supplying the second voltage source VSS to the first gate line.

As the third and fourth clock pulses CLK3 and CLK4 from the timing controller are applied to the enabled third stage AST3, the third stage AST3 outputs the third scan pulse Vout3, and supplies the third scan pulse Vout3 to the third gate line, the fourth stage AST4, and the second stage AST2. Then, the fourth stage AST4 is enabled in response to the third scan pulse Vout3, and the second stage AST2 is disabled in response to the third scan pulse Vout3, thereby supplying the second voltage source VSS to the second gate line.

In this method, the fourth to n-th stages AST4 to ASTn sequentially output the fourth to n-th scan pulses Voutn, and apply the outputted fourth to n-th scan pulses to the fourth to n-th gate lines in sequence. As a result, the first to n-th gate lines are sequentially scanned by the first to n-th scan pulses Vout1 to Voutn outputted from the first to n-th gate lines.

After the dummy stage ASTn+1 is enabled in response to the n-th scan pulse Voutn outputted from the n-th stage ASTn, the two clock pulses from the timing controller are inputted to the dummy stage ASTn+1. Then, as the n+1th scan pulse Voutn+1 is supplied to the n-th stage ASTn, the n-th stage ASTn is disabled, and the second voltage source VSS is supplied to the n-th gate line. The dummy stage ASTn+1 provides the n+1th scan pulse Voutn+1 to the n-th stage ASTn to output the second voltage source VSS, and doesn't provide the n+1th scan pulse Voutn+1 to the gate line. Accordingly, the total number of stages including the dummy stage ASTn+1 is larger than the number of gate lines.

Generally, each of the first to n-th stages and the dummy stage ASTn+1 includes a node control unit for controlling the charging and discharging state of first and second nodes, and an output unit for outputting the first scan pulse Vout1 or the second voltage source VSS according to the state of the first and second nodes, and supplying the first scan pulse Vout1 or the second voltage source VSS to the gate line of the LCD panel.

At this time, the first and second nodes are alternately discharged and discharged. In detail, when the first node is charged, the second node is discharged. In the meantime, when the second node is charged, the first node is discharged.

When the first node is charged, the scan pulse is outputted from a pull-up switching device of the output unit. When the second node is charged, the second voltage source is outputted from a pull-down switching device of the output unit. In this case, the scan pulse outputted from the pull-up switching device and the second voltage source outputted from the pull-down switching device are supplied to the corresponding gate line. Herein, a gate terminal of the pull-up switching device is connected with the first node, a drain terminal thereof is connected with a clock line for the clock pulse, and a source terminal thereof is connected with the gate line. The clock pulse is periodically supplied to the drain terminal of the pull-up switching device. At this time, the pull-up switching device outputs any one of the clock pulses inputted by each period at a predetermined point. The clock pulse outputted at the predetermined point corresponds to the scan pulse for driving the gate line. The predetermined point corresponds to a point in which the first node is charged. That is, the pull-up switching device outputs the clock pulse inputted at the predetermined point (the point in which the first node is charged) as the scan pulse. According as the first node is maintained as the discharge state until the next frame is started after the output of the scan pulse, the pull-up switching device outputs one scan pulse by each frame. However, since the clock pulse is outputted several times during one frame, the clock pulse is inputted to the drain terminal of the pull-up switching device even in the turn-off state of the pull-up switching device, i.e., even in the discharge state of the first node.

In other words, the pull-up switching device is turned-on once during one frame, and also the pull-up switching device outputs the clock pulse, which is inputted to the drain terminal thereof during the turned-on period, as the scan pulse. After that, as the pull-up switching device is turned-off until the next frame is started, the pull-up switching device can not output the clock pulse as the scan pulse even though the clock pulse is inputted to the drain terminal thereof during the turned-off period. According as the clock pulse is periodically applied to the drain terminal of the pull-up switching device, the coupling effect is generated between the first node connected with the gate terminal of the pull-up switching device and the drain terminal of the pull-up switching device. By the coupling effect, the first node is charged with the undesired voltage due to the clock pulse. That is, the first node is maintained in the charge state even at the undesired timing. In this case, the first node may be charged two or more times during one frame, whereby the pull-up switching device may be turned-on two or more times during one frame. Eventually, one stage may output scan pulses two or more times during one frame, thereby causing the multi-output.

A transistor for discharge is provided to prevent the coupling effect. The transistor for discharge responds to the signal outputted from the next stage, and discharges the first node of the corresponding stage, thereby preventing the first node from being charged. However, as the transistor for discharge is deteriorated, the pull-up transistor generates the multi-output due to the coupling effect. The deterioration of the transistor for discharge is caused by the connection between the dummy stage and the other stages, which will be explained in detail.

That is, the dummy stage of the shift register supplies the scan pulse to the n-th stage. However, the dummy stage doesn't supply the scan pulse to the gate line. In other words, the first to n-th stages are connected with the first to n-th gate lines. However, the dummy stage is not connected with the gate line. The gate line functions as one load. Accordingly, the scan pulse outputted from the dummy stage which is not connected with the gate line is larger in value than the scan pulse outputted from the other stages.

The scan pulse outputted from the dummy stage is supplied to the prior stage, and more particularly, to the transistor for discharge provided in the n-th stage. However, the value of the scan pulse outputted from the dummy stage is larger than the value of the scan pulse outputted from the next stage. Accordingly, the transistor for discharge of the n-th stage, to which the scan pulse is applied, can be easily deteriorated. In this case, it is difficult for the transistor to perform the discharge of the first node of the n-th stage. Accordingly, the n-th stage may generate the multi-output due to the coupling effect. The multi-output of the n-th stage is supplied to the prior stage, i.e., (n−1)-th stage. The multi-output is abnormal, whereby the transistor for discharge provided in the (n−1)-th stage is easily deteriorated.

As a result, the discharge transistors, provided in the stages, deteriorate, thereby generating the multi-output. That is, the picture quality of the LCD panel deteriorates due to one stage outputting scan pulses several times during one frame period.

SUMMARY OF THE INVENTION

Accordingly, the present invention is directed to an LCD device that substantially obviates one or more problems due to limitations and disadvantages of the related art.

An object of the present invention is to improve a lifetime of a component in an LCD device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an LCD device includes a plurality of gate lines formed in an LCD panel; a plurality of driving stages, each of which sequentially outputting a respective enabling scan pulse to a corresponding one of the plurality of gate lines; at least one dummy stage responsive to an enabling scan pulse from a first one of the plurality of driving stages and supplying a disabling scan pulse to a second one of the plurality of driving stages to disable outputting of the enabling scan pulse; and a dummy gate line electrically connected to the at least one dummy stage.

In another aspect, a method of driving an LCD device comprising a plurality of gate lines, a plurality of driving stages, at least one dummy stage, and at least one of a dummy gate line and an RC load electrically connected to the at least one dummy stage includes sequentially outputting enabling scan pulses from the plurality of driving stages to corresponding gate lines to drive an LCD panel; and responding to an enabling scan pulse from one of the plurality of driving stages by supplying a disabling scan pulse from the at least one dummy stage to the one of the plurality of driving stages to disable outputting of the enabling scan pulse.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a liquid crystal display (LCD) device according to the preferred embodiment of the present invention will be described with reference to the accompanying drawings.

Figure 1:
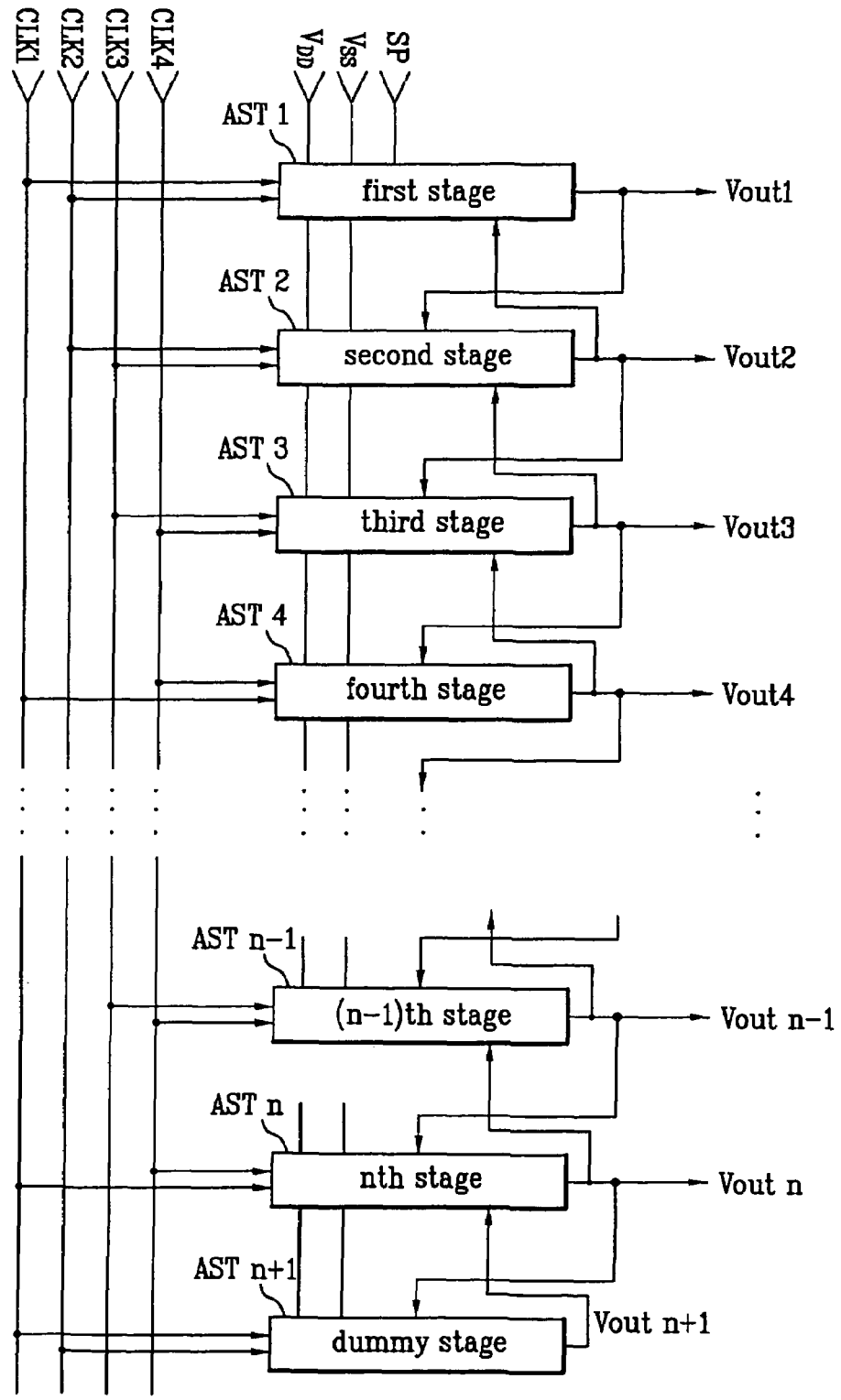
FIG. 1 illustrates a shift register according to the related art.
Figure 2:
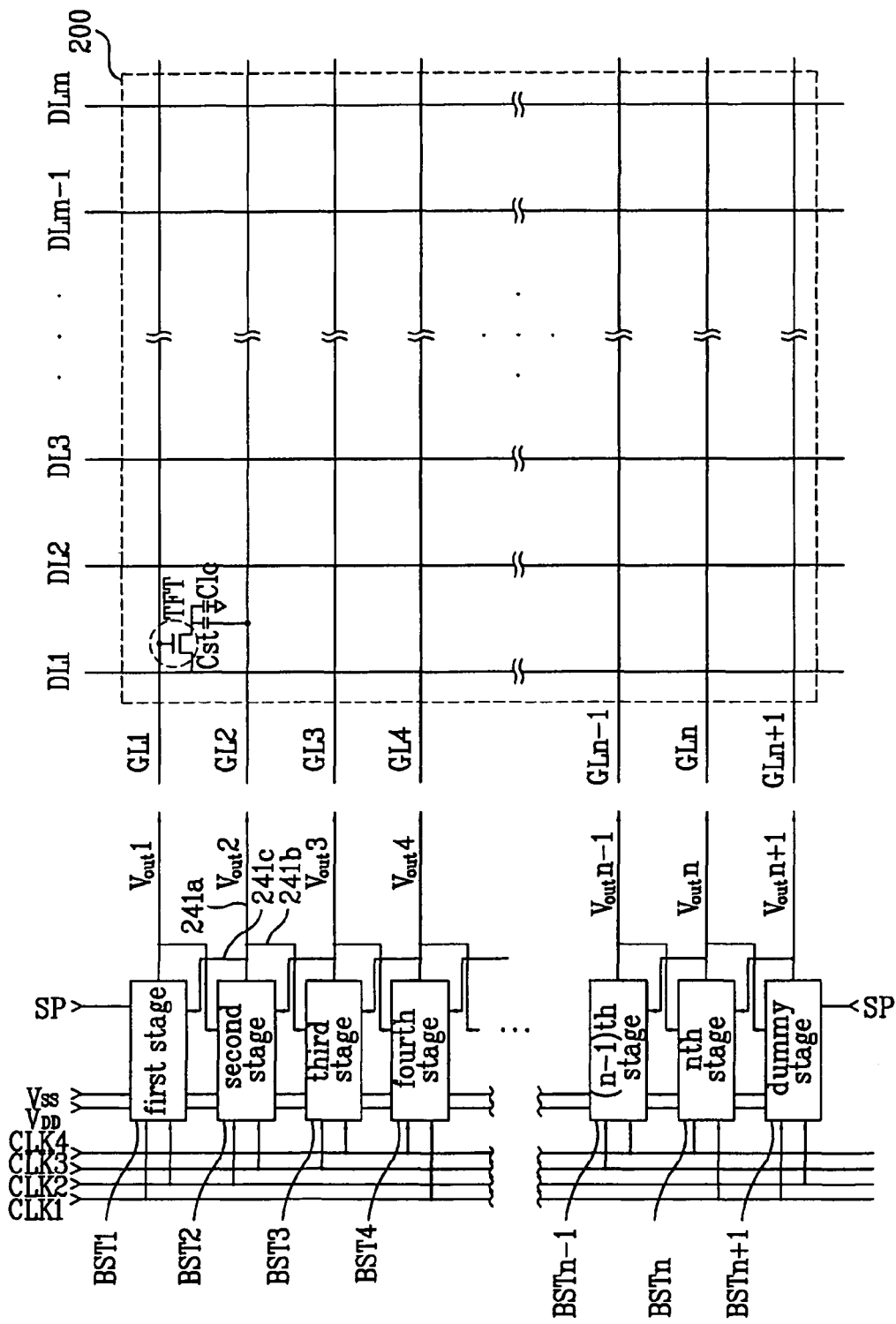
FIG. 2 shows a schematic diagram of an exemplary LCD device according to an embodiment of the present invention.

FIG. 2 shows a schematic diagram of an exemplary LCD device according to an embodiment of the present invention. Referring to FIG. 2, an LCD device includes an LCD panel 200, and a shift register. The LCD panel 200 is provided with a plurality of pixels PXL defined by a plurality of gate lines GL1 to GLn+1 and a plurality of data lines (DL1 to DLm). The shift register drives the plurality of gate lines GL1 to GLn+1 of the LCD panel 200.

The shift register is preferred to be built in the LCD panel 200 to decrease the LCD device.

The shift register is provided with 'n' driving stages BST1 to BSTn which are electrically connected with one another, and one dummy stage BSTn+1. The driving stages BST1 to BSTn+1 output scan pulses Vout1 to Voutn+1, respectively. Specifically, the first to n-th driving stages BST1 to BSTn and the dummy stage BSTn+1 sequentially output scan pulses Vout1 to Voutn+1, respectively. The scan pulses Vout1 to Voutn+1 outputted from the driving stages BST1 to BSTn+1 are sequentially supplied to the gate lines GL1 to GLn+1 of the LCD panel 200 to sequentially scan the gate lines GL1 to GLn+1. That is, the respective first to n-th driving stages BST1 to BSTn are in contact with the first to n-th gate lines GL1 to GLn, and the dummy stage BSTn+1 is in contact with the dummy gate line GLn+1.

In an embodiment, each stage other than a dummy stage and a first stage includes a first output line 241a, a second output line 241b, and a third output line 241c. The first stage BST1 includes the first output line 241a and the second output line 241b, and the dummy stage BSTn+1 includes the first output line 241a and third output line 241c.

Each first output line 241a of each stage BST1 to BSTn+1 connects the output terminal of each stage to a corresponding one of the gate lines GL1 to GLn+1. The second output line 241b of each stage BST1 to BSTn connects the output terminal of the stage to a corresponding next stage. The third output line 241c of each stage BST2 to BSTn+1 connects the output terminal of the stage to a corresponding prior stage.

Each stage BST1 to BSTn+1 supplies the scan pulse to the gate lines GL1 to GLn+1 through the first output line 241a. Each stage BST1 to BSTn supplies the scan pulse to the next stage through the second output line 241b. Further, each stage BST2 to BSTn+1 supplies the scan pulse to the prior stage through the third output line 241c.

In the meantime, all the stages BST1 to BSTn+1 of the shift register receive a first voltage source VDD, a second voltage source VSS, and two clock pulses among first to fourth clock pulses CLK1 to CLK4 of which phase differences are regularly changed in sequence. Herein, the first voltage source VDD is referred to as a positive-polarity voltage source of a high potential. The second voltage source VSS is referred to as a negative-polarity voltage source of a low potential.

Among the stages BST1 to BSTn+1, the first stage BST1 which is positioned uppermost receives a start pulse SP as well as the first voltage source VDD, the second voltage source VSS, and the two clock pulses from the first to fourth clock pulses CLK1 to CLK4. Also, the dummy stage BSTn+1 which is positioned lowermost receives a start pulse SP as well as the first voltage source VDD, the second voltage source VSS, and the two clock pulses from the first to fourth clock pulses CLK1 to CLK4.

As explained above, the first to fourth clock pulses CLK1 to CLK4 are outputted by the phase delay corresponding to one pulse width. That is, the second clock pulse CLK2 is outputted by the phase delay of one pulse width compared to the first clock pulse CLK1. The third clock pulse CLK3 is outputted by the phase delay of one pulse width compared to the second clock pulse CLK2. The fourth clock pulse CLK4 is outputted by the phase delay of one pulse width compared to the third clock pulse CLK3. The first clock pulse CLK1 is outputted by the phase delay of one pulse width compared to the fourth clock pulse CLK4.

The start pulse SP applied to the first stage BST1 is outputted prior to the clock pulses CLK1 to CLK4. That is, the start pulse SP is outputted prior to the first clock pulse CLK1 by one pulse width. Also, the start pulse SP is outputted once in each frame. After the start pulse SP is firstly outputted in each frame, the first to fourth clock pulses CLK1 to CLK4 are outputted in sequence. Herein, the first to fourth clock pulses CLK1 to CLK4 are outputted in sequence and in cycle. That is, after the sequence output from the first to fourth clock pulses CLK1 to CLK4 is finished, the sequence output from the first to fourth clock pulses CLK1 to CLK4 is started again. Accordingly, the first clock pulse CLK1 is outputted in a period between the fourth clock pulse CLK4 and the second clock pulse CLK2. At this time, the fourth clock pulse CLK4 may be outputted in synchronization with the start pulse SP. In this case, the fourth clock pulse CLK4 is outputted firstly.

In an embodiment of the present invention, the shift register may use one or more clock pulses. That is, the shift register may use only a first clock pulse CLK1 among the first to fourth clock pulses CLK1 to CLK4, may use only first and second clock pulses CLK1 and CLK2, or may use only first to third clock pulses CLK1 to CLK3. In addition, the shift register may use the four clock pulses outputted in sequence.

An operation of the shift register described above will be explained in detail. First, as the start pulse SP from a timing controller (not shown) is applied to the first stage BST1, the first stage BST1 is enabled in response to the start pulse SP. Then, as the first and second clock pulses CLK1 and CLK2 from the timing controller are applied to the enabled first stage BST1, the enabled first stage BST1 outputs the first scan pulse Vout1. Then, the first scan pulse Vout1 is supplied to the first gate line GL1 and the second stage BST2. As a result, the second stage BST2 is enabled in response to the first scan pulse Vout1.

Then, as the second and third clock pulses CLK2 and CLK3 from the timing controller are applied to the enabled second stage BST2, the enabled second stage BST2 outputs the second scan pulse Vout2. Then, the second scan pulse Vout2 is supplied to the second gate line GL2, the third stage BST3, and the first stage BST1. As a result, the third stage BST3 is enabled in response to the second scan pulse Vout2, the first stage BST1 is disabled in response to the second scan pulse Vout2, and the second voltage source VSS is supplied to the first gate line GL1.

Then, as the third and fourth clock pulses CLK3 and CLK4 from the timing controller are applied to the enabled third stage BST3, the enabled third stage BST3 outputs the third scan pulse Vout3. Then, the third scan pulse Vout3 is supplied to the third gate line GL3, the fourth stage BST4, and the second stage BST2. As a result, the fourth stage BST4 is enabled in response to the third scan pulse Vout3, the second stage BST2 is disabled in response to the third scan pulse Vout3, and the second voltage source VSS is supplied to the second gate line GL2.

In this method, as the fourth to n-th scan pulses Vout4 to Voutn are sequentially outputted to the fourth to n-th stages BST4 to BSTn, the scan pulses are sequentially applied to the fourth to n-th gate lines GLn. Accordingly, the first to n-th gate lines are sequentially scanned by the first to n-th scan pulses Vout1 to Voutn.

At this time, the dummy stage BSTn+1 is enabled in response to the n-th scan pulse Voutn outputted from the n-th stage BSTn. Then, as the first and second clock pulses CLK1 and CLK2 outputted from the timing controller are applied to the dummy stage BSTn+1, the dummy stage outputs the (n+1)-th scan pulse Voutn+1. The (n+1)-th scan pulse Voutn+1 is supplied to the dummy gate line GLn+1 and the n-th stage BSTn. As a result, the n-th stage BSTn is disabled in response to the (n+1)-th scan pulse Voutn+1, whereby the second voltage source VSS is supplied to the n-th gate line GLn. In the meantime, the dummy stage BSTn+1 is disabled by the start pulse SP.

At this time, the shift register may include a plurality of dummy stages BSTn+1 according to the structure of the stage.

The dummy stage BSTn+1 is operated in the same mode as the first to n-th stages BST1 to BSTn. That is, as the first to n-th stages BST1 to BSTn supply the scan pulses to the respective gate lines, the dummy stage BSTn+1 supplies the scan pulse to the corresponding gate line (dummy gate line GLn+1). That is, each of the gate lines GL1 to GLn+1 functions as one load. Also, the dummy stage BSTn+1, which is connected with the dummy gate line GLn+1, has the same load condition as the other stages. Accordingly, the scan pulse Voutn+1 outputted from the dummy stage BSTn+1 is the same in size as the scan pulse Vout1 to Voutn outputted from each of the stages BST1 to BSTn. Accordingly, it is possible to prevent a failure of the stages BST1 to BSTn+1 caused by coupling.

At this time, the dummy gate line GLn+1 can be formed of the same material as the first to n-th gate lines GL1 to GLn. Moreover, the dummy gate line GLn+1 can have the same shape as the first to n-th gate lines GL1 to GLn. Furthermore, the dummy gate line GLn+1 may have the same resistance and capacitance as the first to n-th gate lines GL1 to GLn.

Meantime, as not shown in drawings, the dummy gate line GLn+1 may be formed in shape of zig-zag to have more resistence.

Figure 3:
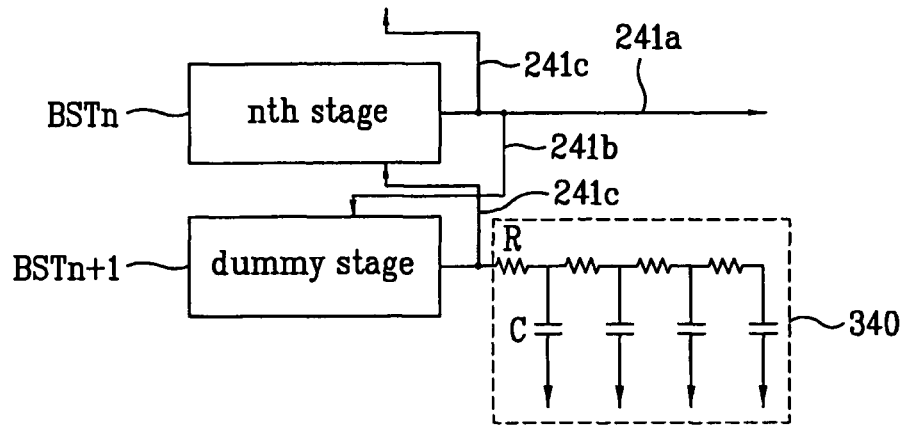
FIG. 3 shows an exemplary RC load connected in parallel with a dummy stage according to another embodiment of the present invention.

FIG. 3 shows an exemplary RC load connected in parallel with a dummy stage according to another embodiment of the present invention. As shown in FIG. 3, the LCD device may include an RC load 340 connected at the output terminal of the dummy stage BSTn+1 instead of the dummy gate line GLn+1. Referring to FIG. 3, the third output line 241c of the dummy stage BSTn+1 is connected in parallel with an RC load 340. The RC load 340 includes a plurality of resistors R which are connected each other in series, and a plurality of capacitors C which are connected in parallel with the resistors R.

Figure 4:
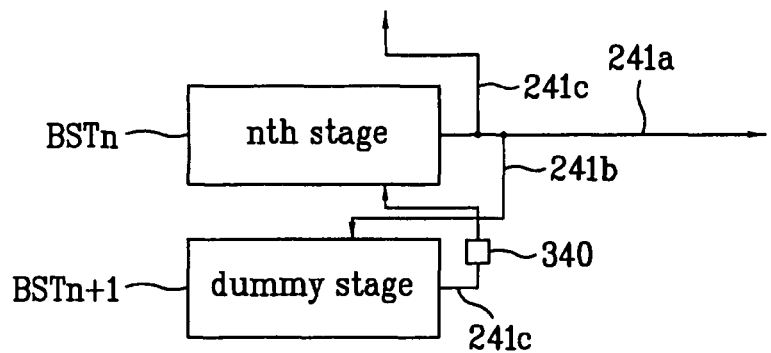
FIG. 4 shows an exemplary RC load connected in series with a dummy stage according to another embodiment of the present invention.

FIG. 4 shows an exemplary RC load connected in series with a dummy stage according to another embodiment of the present invention. As shown in FIG. 4, the RC load 340 may be connected in series with the dummy stage BSTn+1. Referring to FIG. 4, the third output line 241c of the dummy stage BSTn+1 is connected in series with the RC load 340. For example, the RC load 340 connects the dummy stage BSTn+1 with the n-th stage BSTn.

Figure 5:
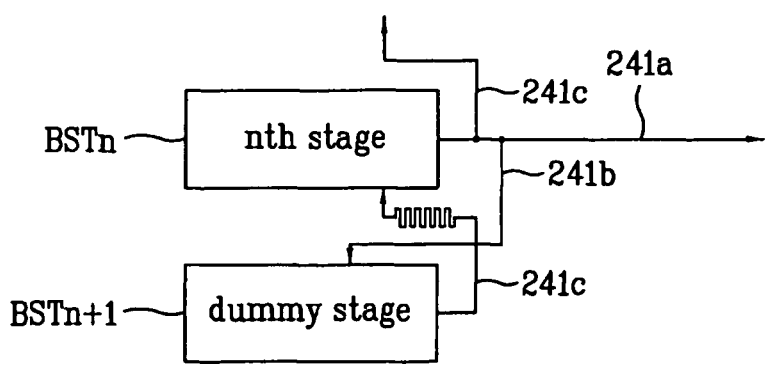
FIG. 5 shows an exemplary shape for an output line in a dummy stage.

FIG. 5 shows an exemplary shape for an output line in a dummy stage. As shown FIG. 5, the third output line 241c of the dummy stage BSTn+1 may have a zig-zag shape. In this case, an additional resistor is not required because of the resistance provided by the zigzag-shaped output line. Accordingly, the size of RC load 340 decreases.

Each of the stages BST1 to BSTn+1 provided in the shift register will be explained in detail. At this time, since the second to n-th stages BST2 to BSTn have the same structure, the exemplary second stage BST is explained as follows.

Figure 6:
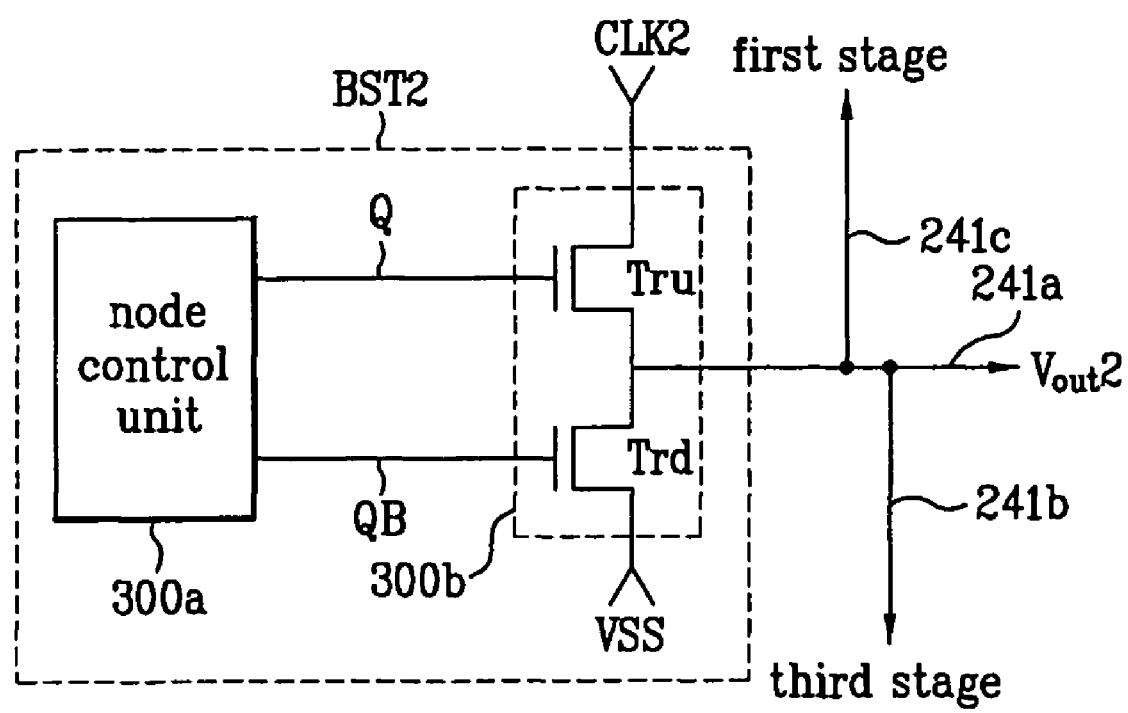
FIG. 6 shows an exemplary second stage of FIG. 2.

FIG. 6 shows an exemplary second stage of FIG. 2. Referring to FIG. 6, the second stage BST2 is provided with a node control unit 300a for controlling the charge and discharge of first and second nodes Q and QB, and an output unit 300b for supplying the scan pulse or the second voltage source VSS to the second gate line GL2 of the LCD panel 200 according to the state of the first and second nodes Q and QB.

The output unit 300b is provided with a pull-up transistor Tru for supplying the scan pulse to the second gate line GL2 when the first node Q is charged, and a pull-down transistor Trd for supplying the second voltage source VSS to the second gate line GL2 when the second node QB is charged.

At this time, the first and second nodes Q and QB are alternately charged and discharged. Specifically, when the first node Q is charged, the second node QB is discharged. Alternately, when the second node QB is charged, the first node Q is discharged. The charge or discharge state of the first and second nodes Q and QB is determined depending on a plurality of switching devices (not shown) provided in the node control unit 300a. The first stage, the third to n-th stages BST3 to BSTn, the dummy stage BSTn+1, and the second stage BST2 are the same in structure.

Figure 7:
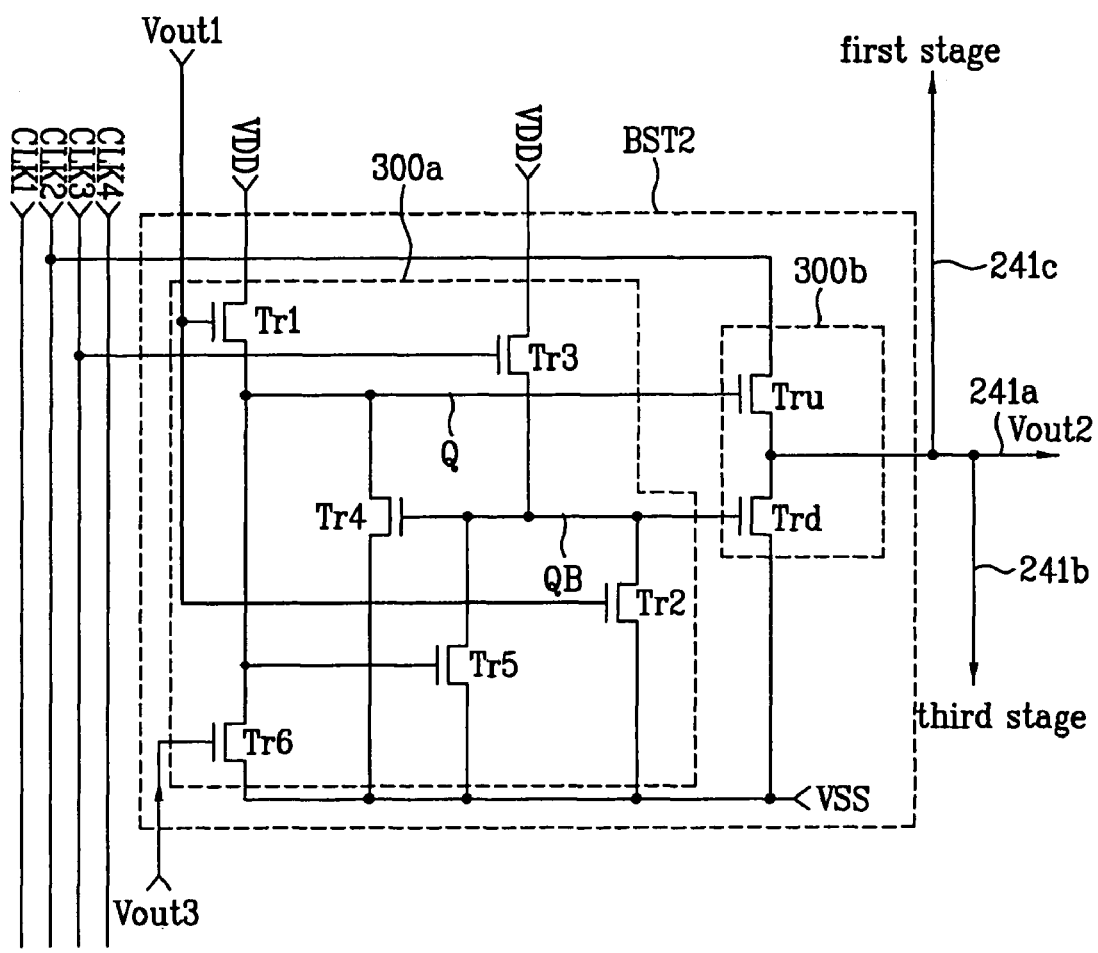
FIG. 7 illustrates exemplary circuit structures of a node control unit and an output unit provided in the second stage.

FIG. 7 illustrates exemplary circuit structures of a node control unit and an output unit provided in the second stage. As shown in FIG. 7, the node control unit 300a is provided with first to sixth NMOS transistors Tr1 to Tr6. The first NMOS transistor Tr1 responds to the scan pulse outputted from the prior stage, and then charges the first node Q with the first voltage source VDD. That is, the first NMOS transistor Tr1 of the second stage BST2 responds to the first scan pulse Vout1 of the first stage BST1, and then charges the first node Q with the first voltage source VDD. For this, a gate terminal of the first NMOS transistor Tr1 is connected with the output unit 300b of the first stage BST1, a drain terminal is connected with a power source line for transmitting the first voltage source VDD, and a source terminal is connected with the first node Q.

The second NMOS transistor Tr2 responds to the scan pulse outputted from the prior stage, whereby the second node QB is discharged with the second voltage source VSS. That is, the second NMOS transistor Tr2 of the second stage BST2 responds to the first scan pulse Vout1 of the first stage BST1, whereby the second node QB is discharged with the second voltage source VSS. For this, a gate terminal of the second NMOS transistor Tr2 is connected with the output unit 300b of the first stage BST1, a drain terminal is connected with the second node QB, and a source terminal is connected with a power source line for transmitting the second voltage source VSS.

The third NMOS transistor Tr3 responds to the clock pulse synchronized with the scan pulse outputted from the next stage, whereby the second node QB is charged with the first voltage source VDD. That is, the third NMOS transistor Tr3 of the second stage BST2 responds to the third clock pulse CLK3 (the clock pulse synchronized with the third scan pulse Vout3 outputted from the third stage BST3), whereby the second node QB is charged with the first voltage source VDD. For this, a gate terminal of the third NMOS transistor Tr3 is connected with a clock line for transmitting the third clock pulse CLK3, a drain terminal is connected with a power source line for transmitting the first voltage source VDD, and a source terminal is connected with the second node QB.

The fourth NMOS transistor Tr4 responds to the first voltage source VDD charged in the second node QB, whereby the first node Q is discharged with the second voltage source VSS. For this, a gate terminal of the fourth NMOS transistor Tr4 is connected with the second node QB, a drain terminal is connected with the first node Q, and a source terminal is connected with a power source line for transmitting the second voltage source VSS.

The fifth NMOS transistor Tr5 responds to the first voltage source VDD charged in the first node Q, whereby the second node QB is discharged with the second voltage source VSS. For this, a gate terminal of the fifth NMOS transistor Tr5 is connected with the first node Q, a drain terminal is connected with the second node QB, and a source terminal is connected with a power source line for transmitting the second voltage source VSS.

The sixth NMOS transistor Tr6 serves as a transistor for discharge, which responds to the scan pulse outputted from the next stage, to discharge the first node Q with the second voltage source VSS. That is, the sixth NMOS transistor Tr6 responds to the third scan pulse of the third stage BST3, whereby the first node Q is discharged with the second voltage source VSS. For this, a gate terminal of the sixth NMOS transistor Tr6 is connected with the output unit 300b of the third stage BST3, a drain terminal is connected with the first node Q, and a source terminal is connected with a power source line for transmitting the second voltage source VSS.

The output unit 300b includes the pull-up transistor Tru and the pull-down transistor Trd. The pull-up transistor Tru responds to the first voltage source VDD charged in the first node Q, and outputs the clock pulse which is prior to the clock pulse applied to the gate terminal of the third NMOS transistor Tr3 by one clock pulse width. That is, the pull-up transistor Tru outputs the second clock pulse CLK2 which is prior to the third clock pulse CLK3 by one pulse width. Then, the pull-up transistor Tru supplies the outputted second clock pulse CLK2 to the gate line connected with the corresponding stage, the prior stage, and the next stage. That is, the pull-up transistor Tru of the second stage BST2 outputs the second clock pulse CLK2 as the second scan pulse Vout2 for driving the second gate line GL2. The second scan pulse Vout2 is supplied to the second gate line GL2, the first stage BST1, and the third stage BST3. For this, a gate terminal of the pull-up transistor Tru is connected with the first node Q, a drain terminal is connected with the clock line for transmitting the second clock pulse CLK2, and a source terminal is connected with the second gate line GL2, the first stage BST1, and the third stage BST3 in common. At this time, the second scan pulse Vout2 supplied to the first stage BST1 disables the first stage BST1, and the second scan pulse Vout2 supplied to the third stage BST3 enables the third stage BST3.

The pull-down transistor Trd responds to the first voltage source VDD charged in the second node QB, and outputs the second voltage source VSS. Then, the pull-down transistor Trd supplies the second voltage source VSS to the gate line connected with the corresponding stage, the prior stage, and the next stage. That is, the pull-down transistor Trd supplies the second voltage source VSS to the second gate line GL2, the first stage BST1, and the third stage BST3. The second voltage source VSS supplied to the second gate line GL2 functions as a signal for disabling the second gate line GL2. For this, a gate terminal of the pull-down transistor Trd is connected with the second node QB, a drain terminal is connected with the second gate line GL2, the first stage BST1, and the third stage BST3 in common, and a source terminal is connected with a power source line for transmitting the second voltage source VSS.

In the meantime, the first NMOS transistor Tr1 shown in FIG. 7 receives the scan pulse of the prior stage instead of the first voltage source VDD, and then supplies the scan pulse to the first node Q. In this case, the first NMOS transistor Tr1 responds to the scan pulse of the prior stage, whereby the first node Q is charged with the scan pulse. For this, the gate and source terminals of the first NMOS transistor Tr1 are connected with the prior stage, and the drain terminal is connected with the first node Q. For example, the gate and source terminals of the first NMOS transistor Tr1 of the second stage are connected with the first stage, and the drain terminal is connected with the first node Q.

Also, the first NMOS transistor Tr1 of the first stage BST1 receives the start pulse SP from the timing controller instead of the first voltage source VDD, and then supplies the start pulse SP to the first node Q. In this case, the first NMOS transistor Tr1 responds to the start pulse ST from the timing controller, whereby the first node Q is charged with the start pulse SP. For this, the gate and source terminals of the first NMOS transistor Tr1 are connected with the timing controller, and the drain terminal is connected with the first node Q.

Also, the third NMOS transistor Tr3 shown in FIG. 7 receives the first voltage source VDD instead of the clock pulse, and then supplies the first voltage source VDD to the second node QB. In this case, the third NMOS transistor Tr3 responds to the first voltage source VDD, whereby the second node QB is charged with the first voltage source VDD. For this, the gate and drain terminals of the third NMOS transistor Tr3 are connected with the prior stage, and the source terminal is connected with the second node QB.

The first stage BST1, the third to n-th stages BSTn, and the dummy stage BSTn+1 are the same in structure as the second stage BST2. However, since there is no stage prior to the first stage BST1, the first NMOS transistor Tr1 provided in the first stage BST1 receives the start pulse SP from the timing controller. That is, the first NMOS transistor Tr1 provided in the first stage BST1 responds to the start pulse SP from the timing controller, whereby the first node Q is charged with the first voltage source VDD. Also, the second NMOS transistor Tr2 provided in the first stage BST1 receives the start pulse SP from the timing controller. That is, the second NMOS transistor Tr2 provided in the first stage BST1 responds to the start pulse SP from the timing controller, whereby the second node QB is discharged with the second voltage source VSS.

To this end, the source terminal of the pull-up transistor Tru provided in the first stage BST1 is connected with the first gate line GL1 and the first stage BST1 in common, and the drain terminal of the pull-down transistor Trd is connected with the first gate line GL1 and the second stage BST2 in common.

There is no stage next to the dummy stage BSTn+1. Accordingly, the (n+1 th scan pulse outputted from the dummy stage BSTn+1 is supplied to the prior stage (that is, the n-th stage BSTn, whereby the n-th stage BSTn is disabled. That is, the source terminal of the pull-up transistor Tru provided in the dummy stage BSTn+1 is connected with the dummy gate line GLn+1 and the n-th stage. Also, the drain terminal of the pull-down transistor Trd provided in the dummy stage is connected with the dummy gate line GLn+1 and the n-th stage BSTn.

Figure 8:
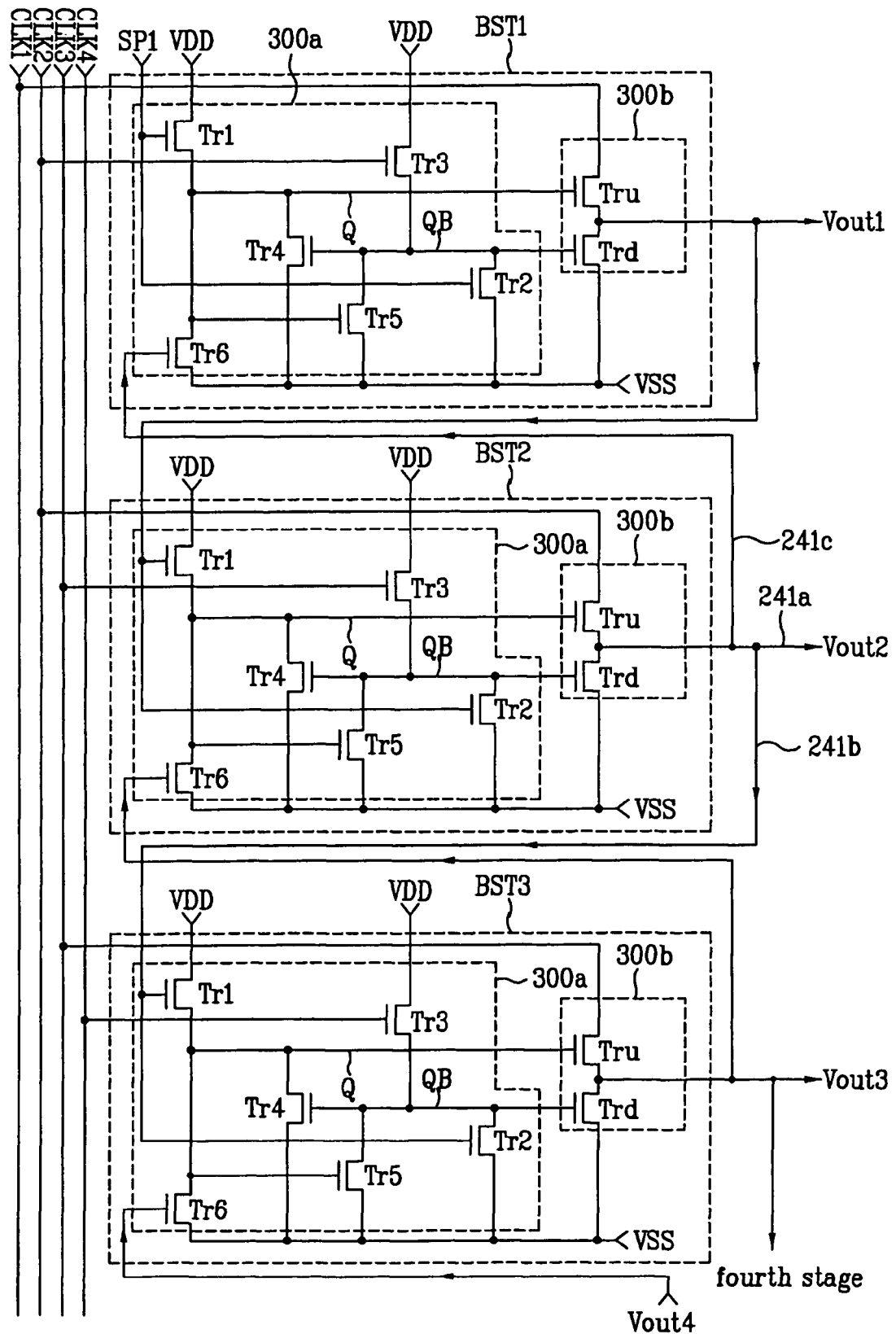
FIG. 8 illustrates exemplary first to third stages of circuit structures of FIG. 2.
Figure 9:
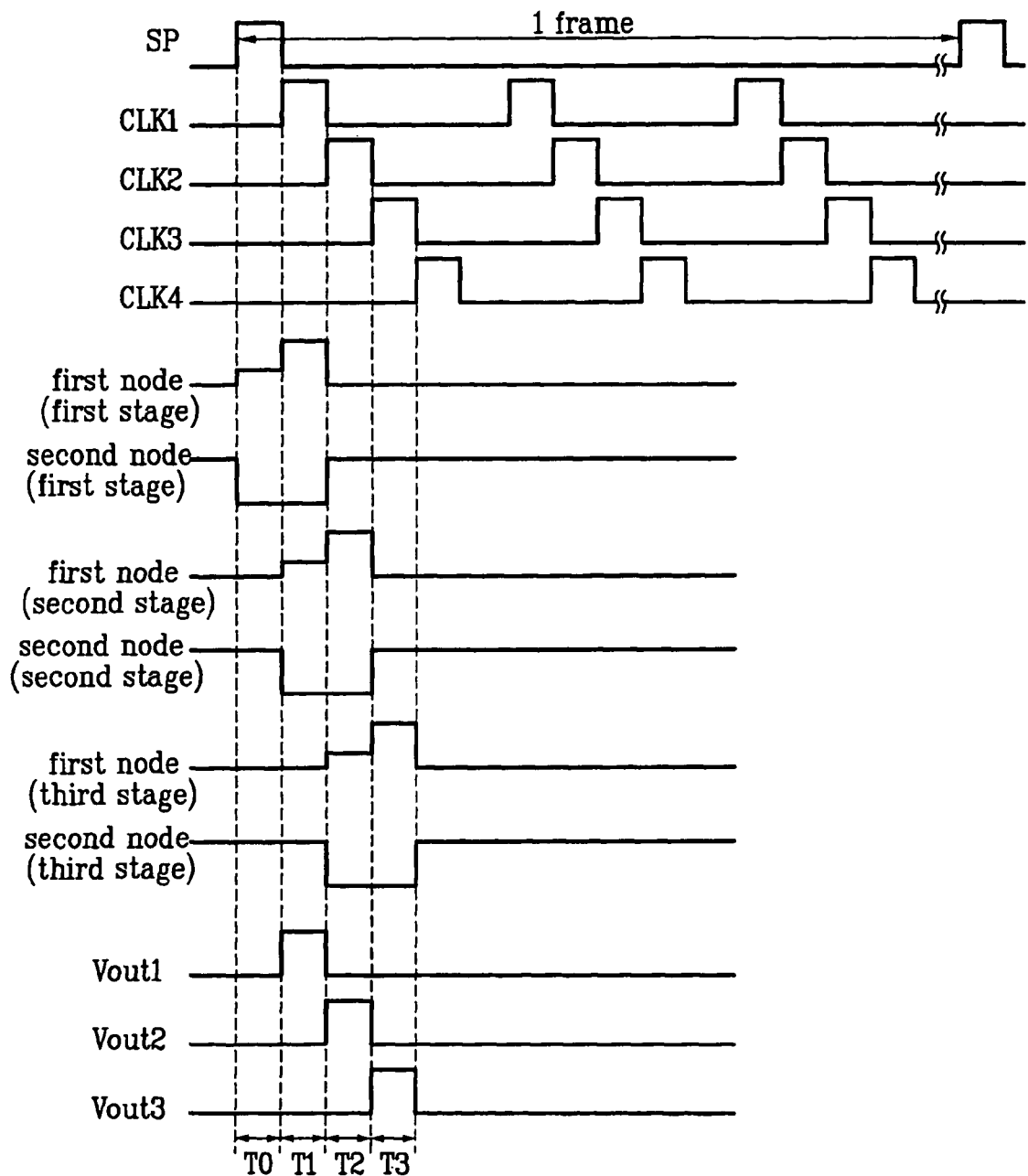
FIG. 9 illustrates timing views of exemplary scan pulses outputted from the stage of FIG. 8, and various signals provided to the stage.

FIG. 8 illustrates exemplary first to third stages of circuit structures of FIG. 2. FIG. 9 illustrates timing views of exemplary scan pulses outputted from the stage of FIG. 8, and various signals provided to the stage. Referring to FIGS. 8 and 9, during an enable period T0, only the start pulse SP outputted from the timing controller is maintained in the high state, and the other start pulses are maintained in the low state.

The start pulse SP outputted from the timing controller is inputted to the first stage BST1. As shown in FIG. 8, the start pulse SP is inputted to the gate terminal of the first NMOS transistor Tr1 provided in the first stage BST1, and the gate terminal of the second NMOS transistor Tr2. As the first and second NMOS transistor Tr1 and Tr2 are turned-on, the first voltage source VDD is applied to the first node Q through the turned-on first NMOS transistor Tr1. Accordingly, as the first node Q is charged, the pull-up transistor Tru connected with the gate terminal of the charged first node Q is turned-on. Also, the second voltage source VSS is applied to the second node QB through the turned-on second NMOS transistor Tr2. Accordingly, the second node QB is discharged by the second voltage source VSS, and the pull-down transistor Trd connected with the gate terminal of the second node QB is turned-off.

During the enable period T0, the start pulse SP outputted from the timing controller is supplied to the dummy stage BSTn+1, and the second to n-th stages BST2 to BSTn. That is, the start pulse SP is supplied to a discharge unit 300c provided in the dummy stage BSTn+1, and discharge units 300c provided in the second to n-th stages BST2 to BSTn. In more detail, the start pulse SP is inputted to a gate terminal of the ninth NMOS transistor Tr9 provided in the dummy stage BSTn+1, and a gate terminal provided in each of the ninth NMOS transistors Tr9 of the second to n-th stages BST2 to BSTn. Accordingly, the respective ninth NMOS transistors Tr9 provided in the dummy stage BSTn+1 and the second to n-th stages BST2 to BSTn are turned-on, whereby the second voltage source VSS is applied to the first node Q of the respective stages BST2 to BSTn+1 through the turned-on ninth NMOS transistors Tr9. As a result, the pull-up transistor Tru connected with the gate terminal of the first node Q of the respective stages BST2 to BSTn+1 is turned-off.

During the enable period T0, as shown in FIG. 9, the first node Q of the first stage BST1 is charged with the first voltage source VDD, and the second node QB is discharged with the second voltage source VSS, thereby enabling the first stage BST1. Then, the outputted start pulse SP is supplied to the gate terminal of the sixth NMOS transistor Tr6 provided in the dummy stage BSTn+1. As the sixth NMOS transistor Tr6 of the dummy stage BSTn+1 is turned-on, the second voltage source VSS is supplied to the first node Q of the dummy stage BSTn+1 through the turned-on sixth NMOS transistor Tr6. Accordingly, the first node Q of the dummy stage BSTn+1 is discharged, and the pull-up transistor Tru, of which the gate terminal is connected to the first node Q, is tuned-off. As a result, the dummy stage BSTn+1 is disabled during the enable period T0.

A first period T1 will be explained as follows. During the first period T1, as shown in FIG. 9, the first clock pulse CLK1 is maintained in the high state, and the other clock pulses are maintained in the low state. Accordingly, the first and second NMOS transistors Tr1 and Tr2 of the first stage BST1 are turned-off in response to the start pulse SP of the low state. Especially, as the first NMOS transistor Tr1 is turned-off, the first node Q of the first stage BST1 is maintained in the floating state.

Then, as the first node Q of the first stage BST1 is maintained as the first voltage source VDD applied during the enable period T0, the pull-up transistor Tru of the first stage BST1 is maintained in the turned-on state. According as the first clock pulse CLK1 is applied to the drain terminal of the turned-on pull-up transistor Tru, as shown in FIG. 9, the first voltage source VDD charged in the first node Q of the first stage BST1 is amplified by bootstrapping. Accordingly, the first clock pulse CLK1 applied to the drain terminal of the pull-up transistor Tru of the first stage BST1 is stably outputted through the source terminal of the pull-up transistor Tru. At this time, as shown in FIG. 9, the outputted first clock pulse CLK1 is applied to the first gate line GL1, and the first clock pulse CLK1 functions as the first scan pulse Vout1 for driving the first gate line GL1.

At this time, the first scan pulse Vout1 is supplied to the first gate line GL1, and also is inputted to the second stage BST2. As shown in FIG. 8, the first scan pulse Vout1 is inputted to the gate terminal of the first NMOS transistor Tr1 provided in the second stage BST2, and is inputted to the gate terminal of the second NMOS transistor Tr2. At this time, the first scan pulse Vout1 supplied to the second stage BST2 has the same function as the start pulse SP supplied to the first stage BST1. That is, the second stage BST2 is enabled in response to the first scan pulse Vout1. In detail, the first node Q of the second stage BST2 is charged with the first voltage source VDD by the first scan pulse Vout1, and the second node QB is discharged. That is, the first scan pulse Vout1 outputted from the first stage BST1 during the first period T1 drives the first gate line GL1. At the same time, as shown in FIG. 9, the first node Q of the second stage BST2 is charged, and the second node QB is discharged, thereby enabling the second stage BST2.

A second period T2 will be explained as follows. During the second period T2, as shown in FIG. 9, the second clock pulse CLK2 is maintained in the high state, and the other clock pulses are maintained in the low state. During the second period T2, as the first scan pulse Vout1 of the first period T1 outputted from the first stage BST1 is changed to the low state, the first and second NMOS transistors of the second stage applied through the gate terminal are turned-off. Accordingly, the first node Q of the second stage BST2 is maintained in the floating state. In the meantime, according as the first node Q of the second stage BST2 is maintained as the first voltage source VDD which is applied during the first period T1, the pull-up transistor Tru of the second stage BST2 is maintained in the turn-on state. At this time, as the second clock pulse CLK2 is applied to the drain terminal of the pull-up transistor Tru of the second stage BST2, the first voltage source VDD charged in the first node Q of the second stage BST2 is amplified by bootstrapping. Accordingly, the second clock pulse CLK2 applied to the drain terminal of the pull-up transistor Tru is stably outputted through the source terminal of the pull-up transistor Tru. At this time, as shown in FIG. 9, the second clock pulse CLK2 outputted from the second stage BST2 is applied to the second gate line GL2, and the second clock pulse CLK2 functions as the second scan pulse Vout2 for driving the second gate line GL2.

At this time, the second scan pulse Vout2 outputted from the second stage BST2 is inputted to the first stage BST1. In detail, as shown in FIG. 8, the second scan pulse Vout2 is inputted to the gate terminal of the sixth NMOS transistor Tr6 of the first stage BST1. At this time, as the sixth NMOS transistor Tr6 of the first stage BST1 is turned-on by the second scan pulse Vout2, the second voltage source VSS is supplied to the first node Q of the first stage BST1 through the turned-on sixth NMOS transistor Tr6. Accordingly, as shown in FIG. 9, the first node Q of the first stage BST1 is discharged by the second voltage source VSS. Thus, the pull-up transistor Tru of which the gate terminal is connected with the first node Q of the first stage BST1 is turned-off.

In the meantime, the second clock pulse CLK2 outputted during the second period T2 is applied to the gate terminal of the third NMOS transistor Tr3 of the first stage BST1, whereby the third NMOS transistor Tr3 of the first stage BST1 is turned-on. At this time, the first voltage source VDD is supplied to the second node QB of the first stage BST1 through the turned-on third NMOS transistor Tr3. Accordingly, as shown in FIG. 9, the second node QB of the first stage BST1 is charged by the first voltage source VDD. Then, the pull-down transistor Trd connected with the second node QB of the first stage BST1 is turned-on. At this time, the second voltage source VSS is supplied to the first gate line GL1 through the turned-on pull-down transistor Trd. Accordingly, the second voltage source VSS functions as a signal for disabling the first gate line GL1. During the second period T2, the first stage BST1 is disabled by the second scan pulse Vout2.

During the second period T2, the second scan pulse Vout2 outputted from the second stage BST2 is inputted to the third stage BST3. In detail, as shown in FIG. 8, the second scan pulse Vout2 is inputted to the gate terminals of the first and second NMOS transistors Tr1 and Tr2 provided in the third stage BST3. Accordingly, the first node Q of the third stage BST3 is charged, and the second node QB is discharged. That is, the third stage BST3 is enabled by the second scan pulse Vout2.

During the second period T2, the second scan pulse Vout2 is outputted from the second stage BST2. The second scan pulse Vout2 drives the second gate line GL2, disables the first stage BST1, and enables the third stage BST3.

During a third period T3, the third stage BST3 outputs the third scan pulse Vout3, thereby driving the third gate line GL3. The third scan pulse Vout3 is supplied to the second stage BST2 and the fourth stage BST4, thereby disabling the second stage BST2, and enabling the fourth stage BST4. During a fourth period, the fourth stage BST4 outputs the fourth scan pulse Vout4. The fourth scan pulse Vout4 disables the third stage BST3, and enables the fifth stage BST5.

In this method, the first to n-th stages BST1 to BSTn and the dummy stage BSTn+1 sequentially output the scan pulses. The scan pulse Voutn+1 outputted from the dummy stage BSTn+1 is supplied to the dummy gate line GLn+1 and the n-th stage BSTn. At the start of the next frame, the dummy stage BSTn+1 is disabled by the start pulse SP outputted from the timing controller.

According to an embodiment of the present invention, the LCD device includes a dummy gate line connected with a dummy stage of the shift register. Accordingly, the load applied to the output unit of the dummy stage is maintained in the same condition as the load applied to the output units of the other stages. Accordingly, the scan pulse outputted from the dummy stage has the same size as the scan pulse outputted from the other stages. As a result, it is possible to prevent the deterioration of the pull-up transistor and the pull-down transistor provided in each of the stages, thereby increasing the lifetime of the shift register.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An LCD device, comprising:
a plurality of gate lines formed in an LCD panel;
a plurality of driving stages, each of which sequentially outputting a respective scan pulse to a corresponding one of the plurality of gate lines;
a dummy stage responsive to a scan pulse from a last driving stage and supplying a disabling scan pulse to the last driving stage to disable outputting of the scan pulse, wherein the last driving stage outputs a scan pulse later than the other driving stages; and
a dummy gate line electrically connected to the dummy stage, wherein the dummy gate line is supplied with the disabling scan pulse from the dummy stage;
wherein a start pulse is supplied to both the dummy stage and a first driving stage;
wherein the dummy stage is disabled by the start pulse, and the first driving stage is enabled by the start pulse;
wherein the first driving stage outputs a scan pulse earlier than the other driving stages;
wherein each of the driving stage includes a first switching device for charging the first node with a high-potential voltage source in response to the start pulse or the driving scan pulse of the preceding driving stage; a second switching device for discharging the second node with a low-potential voltage source in response to the start pulse or the scan pulse of the preceding driving stage; a third switching device for charging the second node with a high-potential voltage source in response to the first clock pulse synchronized with the scan pulse outputted from the following driving stage; a fourth switching device for discharging the first node with a low-potential voltage source in response to the high-potential voltage source charged in the second node; a fifth switching device for discharging the second node with the low-potential voltage source in response to the high-potential voltage source charged in the first node; a sixth switching device for discharging the first node with the low-potential voltage source in response to the scan pulse outputted from the following driving stage; a pull-up switching device for outputting a second clock pulse prior to the first clock pulse as the scan pulse in response to the high-potential voltage source charged in the first node; and a pull-down switching device for outputting the low-potential voltage source in response to the high-potential voltage source charged in the second node.

2. The LCD device of claim 1, wherein the dummy stage includes:
   a node control unit for controlling the charge and discharge of third and fourth nodes; and
   an output unit for outputting the disabling scan pulse according to a state of the third node, and outputting a low-potential voltage source according to a state of the fourth node.

3. The LCD device of claim 2, wherein the node control unit of the dummy stage includes:
   a first switching device for charging the third node with a high-potential voltage source in response to the scan pulse of the last driving stage;
   a second switching device for discharging the fourth node with a low-potential voltage source in response to the scan pulse of the last driving stage;
   a third switching device for charging the fourth node with a high-potential voltage source in response to the high-potential voltage source;
   a fourth switching device for discharging the third node with a low-potential voltage source in response to the high-potential voltage source charged in the fourth node;
   a fifth switching device for discharging the fourth node with the low-potential voltage source in response to the high-potential voltage source charged in the third node; and
   a sixth switching device for discharging the third node with the low-potential voltage source in response to the start pulse.

4. The LCD device of claim 3, wherein an output unit of the dummy stage includes:
   a pull-up switching device for outputting a fourth clock pulse prior to the third clock pulse as the scan pulse in response to the high-potential voltage source charged in the third node; and
   a pull-down switching device for outputting the low-potential voltage source in response to the high-potential voltage source charged in the fourth node.

5. The LCD device of claim 1, further comprising a plurality of data lines crossing the gate lines and at least one dummy gate line.

6. The LCD device of claim 1, wherein the at least one dummy gate line is formed in a shape of a zigzag.

* * * * *